(12) United States Patent
Sun et al.

(10) Patent No.: US 12,745,497 B2
(45) Date of Patent: Sep. 22, 2026

(54) LIGHT EMITTING CHIP AND MANUFACTURING METHOD FOR THE SAME, AND LIGHT EMITTING DEVICE

(71) Applicant: BOE Technology Group Co., Ltd., Beijing (CN)

(72) Inventors: Shuang Sun, Beijing (CN); Fangzhen Zhang, Beijing (CN); Xinxing Wang, Beijing (CN); Jing Niu, Beijing (CN); Tingting Zhou, Beijing (CN); Wei Wang, Beijing (CN); Yanan Niu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 792 days.

(21) Appl. No.: 18/026,476

(22) PCT Filed: May 30, 2022

(86) PCT No.: PCT/CN2022/096049
§ 371 (c)(1),
(2) Date: Mar. 15, 2023

(87) PCT Pub. No.: WO2023/230779
PCT Pub. Date: Dec. 7, 2023

(65) Prior Publication Data

US 2024/0297203 A1 Sep. 5, 2024

(51) Int. Cl.
*H10W 90/00* (2026.01)
*H10H 29/14* (2025.01)

(52) U.S. Cl.
CPC .......... *H10H 29/142* (2025.01); *H10W 90/00* (2026.01)

(58) Field of Classification Search
CPC .... H10H 29/142; H10H 20/80; H10H 20/835; H10H 20/857; H10H 29/10; H01L 25/18
See application file for complete search history.

(56) References Cited

U.S. PATENT DOCUMENTS

| | | | | |
|---|---|---|---|---|
| 2003/0047742 | A1* | 3/2003 | Hen | H01L 25/0756 257/89 |
| 2020/0152693 | A1 | 5/2020 | Zou et al. | |
| 2021/0336074 | A1 | 10/2021 | Sun | |
| 2022/0109022 | A1 | 4/2022 | Choi et al. | |
| 2022/0344312 | A1 | 10/2022 | Huo et al. | |

FOREIGN PATENT DOCUMENTS

| | | | |
|---|---|---|---|
| CN | 107994047 | A | 5/2018 |
| CN | 108886050 | A | 11/2018 |
| CN | 108899337 | A | 11/2018 |
| CN | 109119429 | A | 1/2019 |
| CN | 110265520 | A | 9/2019 |
| CN | 114068609 | A | 2/2022 |
| CN | 114388549 | A | 4/2022 |

* cited by examiner

*Primary Examiner* — Elias Ullah
(74) *Attorney, Agent, or Firm* — WHDA, LLP

(57) ABSTRACT

The present application provides a light emitting chip, a manufacturing method for the same, and a light emitting device, relating to the field of display technology. The light emitting chip includes a substrate and a plurality of light emitting units arranged in an array on the substrate. The light emitting unit includes at least one first electrode disposed on the substrate and a plurality of epitaxial wafers arranged in an array, at least two of the epitaxial wafers have different colors. Several epitaxial wafers in the epitaxial wafers share one of the first electrodes.

18 Claims, 6 Drawing Sheets

LIGHT EMITTING CHIP AND MANUFACTURING METHOD FOR THE SAME, AND LIGHT EMITTING DEVICE

TECHNICAL FIELD

The present application relates to the field of display technology, in particular to a light emitting chip, a manufacturing method for the same, and a light emitting device.

BACKGROUND

Micro Light Emitting Diode (Micro LED for short) and Mini Light Emitting Diode (Mini LED for short) are a major trend in the development of Light Emitting Diode (LED) technology in recent years. Micro/Mini LED light emitting chips can be widely used in backlights for liquid crystal display, Micro/Mini RGB displays, small-pitch displays and other fields.

At present, the size of Micro/Mini LED light emitting chips is very small, resulting in problems that, during the mass transfer of Micro/Mini LED light emitting chips, a huge quantity of light emitting chips exist, the number of transferring is high, and a long time is taken, which is extremely unfavorable for industrialization.

SUMMARY

Embodiments of the present application adopt technical solutions below.

In one aspect, embodiments of the present application provide a light emitting chip, including:

- a substrate;
- a plurality of light emitting units arranged in an array on the substrate, each of the light emitting units includes at least one first electrode arranged on the substrate and a plurality of epitaxial wafers arranged in an array, and at least two of the epitaxial wafers have different colors; and several epitaxial wafers in the epitaxial wafers share one of the at least one first electrode.

Optionally, at least two epitaxial wafers of different colors in the plurality of epitaxial wafers share one of the at least one first electrode.

Optionally, all the epitaxial wafers share one of the at least one first electrode.

Optionally, all the epitaxial wafers are divided into several groups, each of the groups comprises at least two epitaxial wafers of different colors, and each of the groups shares one of the at least one first electrode.

Optionally, the epitaxial wafers includes at least a blue epitaxial wafer and a green epitaxial wafer, and the blue epitaxial wafer and the green epitaxial wafer share one of the at least one first electrode.

Optionally, each of the light emitting units further includes a conductive layer, and the conductive layer is electrically connected to the epitaxial wafers and the at least one first electrode.

Optionally, the conductive layer is arranged as an entire layer, and all the epitaxial wafers are electrically connected to the at least one first electrode through the conductive layer.

Optionally, the conductive layer includes a plurality of discrete conductive sublayers; all the epitaxial wafers are divided into several groups, each of the groups includes at least two epitaxial wafers, and each group of the epitaxial wafers are electrically connected to one of the at least first electrode through one of the conductive sublayers respectively.

Optionally, an orthographic projection of the conductive layer on the substrate partially overlaps with an orthographic projection of the epitaxial wafer on the substrate, and the conductive layer is in direct contact with the epitaxial wafer.

Optionally, the conductive layer is disposed on a side of the substrate close to the epitaxial wafer: the epitaxial wafer includes a side surface, a first surface and a second surface opposite to each other, wherein the first surface and the second surface are both connected to the side surface, and the second surface of the epitaxial wafer is located on a side of the epitaxial wafer facing away from the substrate; the light emitting unit further includes an insulation layer disposed on a side of the conductive layer close to the epitaxial wafer, and the insulation layer covers at least part of the side surface of the epitaxial wafer.

Optionally, the epitaxial wafer includes an electron injection layer and an emission layer stacked in sequence: the conductive layer covers at least part of the side surface of the electron injection layer, and is not in contact with the side surface of the emission layer.

Optionally, the insulation layer includes a first insulation sublayer and a second insulation sublayer stacked in sequence; each of the epitaxial wafers further includes a hole injection layer arranged on a side of the emission layer facing away from the electron injection layer; the conductive layer and the first insulation sublayer both cover part of the side surface of the electron injection layer; the second insulation sublayer covers at least the side surface of the emission layer and the side surface of the hole injection layer.

Optionally, material of the conductive layer includes any one of metal, conductive photoresist, and conductive fluid.

Optionally, each of the light emitting units further includes: a current spreading layer disposed on a side of the hole injection layer facing away from the substrate; and a reflective layer disposed on a side of the electron injection layer close to the substrate; the light emitting unit further includes a second electrode disposed on a side of the current spreading layer facing away from the substrate; the first electrode is disposed on a side of the conductive layer facing away from the substrate, and is electrically connected to the conductive layer.

Optionally, each of the light emitting units further includes: a current spreading layer disposed on a side of the hole injection layer facing away from the substrate; and a reflective layer covering the current spreading layer; the light emitting unit further includes a second electrode disposed on a side of the reflective layer facing away from the substrate, the second electrode is electrically connected to the current spreading layer through a via hole in the reflective layer; the first electrode is disposed on a side of the conductive layer close to the substrate, and is electrically connected to the conductive layer; or the first electrode is disposed on a side of the conductive layer facing away from the substrate, and is electrically connected to the conductive layer.

Optionally, a distance between adjacent light emitting units is greater than a distance between adjacent epitaxial wafers.

In another aspect, embodiments of the present application further provide a light emitting device including the above light emitting chip.

In yet another aspect, embodiments of the present application provide a method for manufacturing the above light emitting chip. the light emitting chip includes a substrate and a plurality of light emitting units arranged in an array on the substrate, wherein each of the light emitting units includes a conductive layer and an epitaxial wafer, and the conductive layer is arranged on a side of the epitaxial wafer close to the substrate, and is electrically connected to the epitaxial wafer;

the method includes:

providing the substrate;

forming the conductive layer on the substrate;

processing the conductive layer to form at least one first recess penetrating through the conductive layer; and forming the epitaxial wafer in the first recess.

Optionally, each of the light emitting units further includes a first insulation sublayer disposed on a side of the conductive layer facing away from the substrate;

after processing the conductive layer to form at least one first recess penetrating through the conductive layer, the method further includes:

forming the first insulation sublayer on the conductive layer with the at least one first recess;

processing the first insulation sublayer to form at least one second recess penetrating through the first insulation sublayer, wherein each of the first recesses is arranged in correspondence to each of the second recesses; and forming the epitaxial wafer in the first recess and the second recess.

Optionally, the light emitting unit further includes a second insulation sublayer disposed on a side of the first insulation sublayer facing away from the substrate;

the forming the epitaxial wafer in the first recess and the second recess includes: forming a blue epitaxial wafer in the first recess and the second recess;

after the forming the epitaxial wafer in the first recess and the second recess, the method further includes:

forming the second insulation sublayer on the first insulation sublayer and the blue epitaxial wafer;

processing the second insulation sublayer, the first insulation sublayer and the conductive layer to form at least one third recess penetrating through the second insulation sublayer, the first insulation sublayer and the conductive layer, wherein a spacing exists between the first recess and the third recess as well as between the second recess and the third recess; and forming a green epitaxial wafer in the third recess.

The above description is only a summary of solutions of the present disclosure. In order to learn technical means of the present disclosure more clearly and allow the technical means to be implemented based on the disclosure of the description, and in order to make the above and other objects, features and advantages of the present disclosure more apparent and understandable, specific embodiments of the present disclosure are illustrated below.

BRIEF DESCRIPTION OF THE DRAWINGS

In order to clearly explain technical solutions of embodiments of the present disclosure or the related art, drawings required in the description of the embodiments or the related art are briefly introduced below. Apparently, the drawings in the following description are only some embodiments of the present disclosure. For those skilled in the art, other drawings can be obtained based on these drawings without paying creative work.

DETAILED DESCRIPTION

Figure 1:
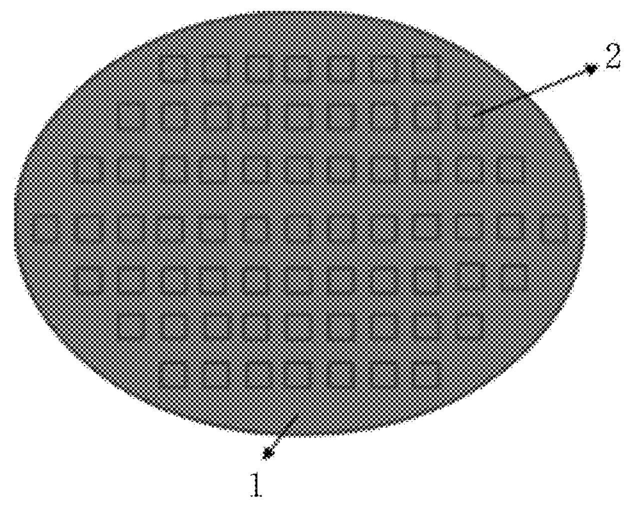
FIG. 1 is a schematic structural diagram illustrating a light emitting chip provided in an embodiment of the present application.

To make the objectives, technical solutions and advantages of the embodiments of the present application clearer, the technical solutions of the embodiments of the present application will be clearly, thoroughly described below with reference to the accompanying drawings of the embodiments of the present application. Apparently, only a part of the embodiments, not all the embodiments of the present application, are described. All other embodiments obtained, based on the embodiments described in the present application, by those skilled in the art without paying creative efforts shall fall within the protection scope of the present application.

In the drawings, the thicknesses of regions and layers may be exaggerated for clarity. The same reference numerals in the drawings denote the same or similar structures, and thus detailed descriptions thereof will be omitted. In addition, the drawings are merely schematic illustrations of the present disclosure and are not necessarily drawn to scale.

In the embodiments of the present application, unless otherwise specified, "multiple" means two or more; the orientation or positional relationship indicated by the terms "upper" is based on the orientation or positional relationship shown in the drawings, and is only for the convenience of describing the present application and simplifying the description, but does not indicate or imply that the structures or elements referred to must have a specific orientation, be constructed and operated in a specific orientation, and thus should not be construed as limiting the present application.

Unless it is specified in the context, otherwise, the term "comprising/including" throughout the specification and claims is interpreted in an open and inclusive sense, i.e., "including, but not limited to". In the description of the specification, the terms such as "an embodiment", "some embodiments", "exemplary embodiments", "example", "specific examples" or "some examples" are intended to indicate that particular features, structures, materials, or properties related to the embodiment or example are included in at least one embodiment or example of the present application. Schematic representations of the above terms are not necessarily referring to the same embodiment or example. Furthermore, the particular features, structures, materials or characteristics described may be included in any one or more embodiments or examples in any suitable manner.

In the embodiments of the present application, wordings such as "first", "second" are used to distinguish the same or similar items with substantially the same functions and effects, which are only used for clearly describing solutions of the embodiments of the present application, and should not be understood as indicating or implying the relative importance or implying the number of indicated technical features.

In the related art, Micro/Mini LED display technology generally adopts the method of growing Micro/Mini LED light emitting chips of different colors on different substrates, for example, the light emitting chips of three colors R (red). G (green), and B (blue) are grown on different substrates respectively. Then, when the light emitting chips of three colors R, G, B are served as display light emitting units and transferred to the drive backplane, the light emitting chips need to be transferred in batches according to homochromy, that is, the R light emitting chips, G light emitting chips, and B light emitting chips are transferred to the drive backplane in batches, respectively.

Since the size of Micro/Mini LED light emitting chips is very small, the quantity of light emitting chips of different colors to be transferred in batches is huge, the number of transferring is large and a long time is taken for the transferring.

In view of the above, embodiments of the present application provide a light emitting chip. Referring to FIG. 1 to FIG. 5, the light emitting chip includes:

a substrate 1; and a plurality of light emitting units 2 arranged in an array on the substrate 1; each light emitting unit 2 including at least one first electrode 3 arranged on the substrate 1 and a plurality of epitaxial wafers arranged in an array, the colors of at least two of the epitaxial wafers are different;

and several epitaxial wafers share one first electrode 3.

The light emitting chip refers to a base plate with multiple independent chips fabricated on the substrate. After the chips in the light emitting chip are manufactured, tested, and screened, chips that meet the requirements are mass transferred to the light emitting device for application. The type of the chip is not specifically limited herein. For example, the chip may include a Micro LED chip; or, the chip may also include a Mini LED chip.

The epitaxial wafer generally includes an electron injection layer, an emission layer, and a hole injection layer stacked in sequence. Usually, the epitaxial wafer, the first electrode, and a second electrode located on a side of the epitaxial wafer facing away from the substrate together form a Micro/Mini LED chip.

The material of the substrate is not specifically limited here. Exemplarily, the material of the substrate may include any one of sapphire, silicon or silicon carbide.

The plurality of light emitting units are arranged in an array on the substrate. A plurality of light emitting units arranged in an array are disposed on the substrate of the light emitting chip, each light emitting unit has a specific area, and each light emitting unit includes a certain number of light emitting chips. For example, a certain area at the edge of the light emitting chip is a light emitting unit, and a certain area at the center of the light emitting chip is a light emitting unit. These light emitting units are separated from each other and a certain distance is reserved, so that the chips in each light emitting unit can be independently manufactured, tested, and the like.

Each of the light emitting units includes at least one first electrode disposed on the substrate. The quantity of the first electrodes is not specifically limited here, for example, it may be one or multiple. The material of the first electrode is not specifically limited here, for example, it may include metal, such as chromium/platinum/gold, titanium/gold. The polarity of the first electrode is not specifically limited here, for example, the first electrode may be an n-type electrode or a p-type electrode. FIG. 2 to FIG. 5 each shows an example in which a light emitting unit includes one first electrode 3 and the first electrode 3 is an n-type electrode.

At least two epitaxial wafers in the plurality of epitaxial wafers have different colors. The quantity of epitaxial wafers of different colors is not specifically limited here, for example, the quantity of epitaxial wafers of different colors can be two; or, the quantity of epitaxial wafers of different colors can be three or more. The colors of the epitaxial wafers of different colors are not specifically limited here, for example, the colors of such epitaxial wafers may be blue, green, red and so on. FIG. 2 to FIG. 5 each shows an example in which a light emitting unit includes two epitaxial wafers, one of which is a blue epitaxial wafer 41 and the other is a green epitaxial wafer 42.

Figure 2:
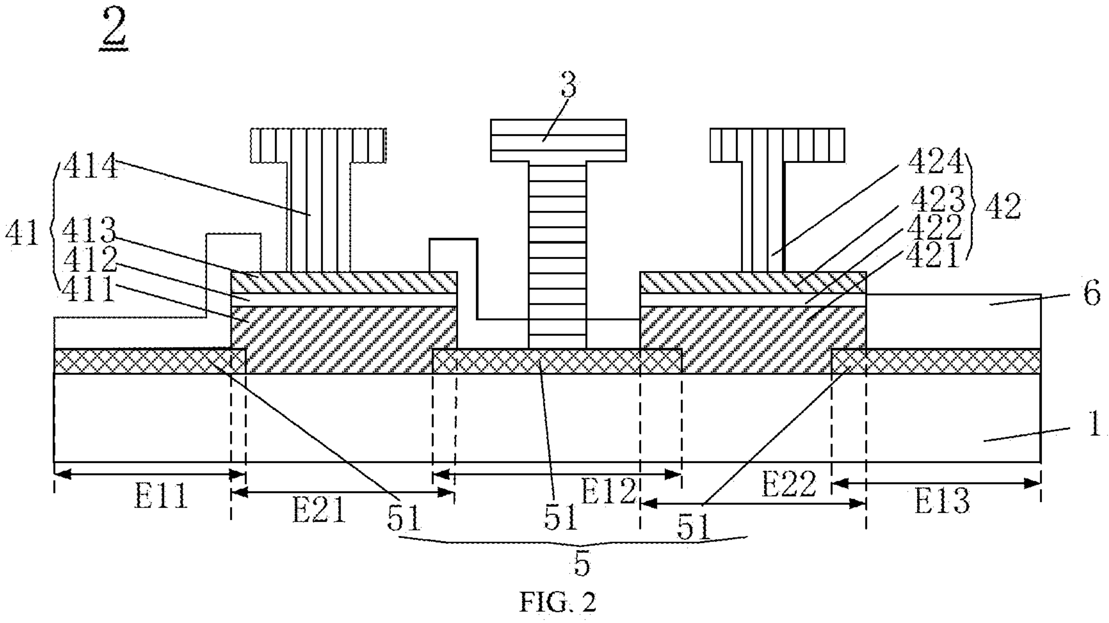
FIG. 2 is a schematic structural diagram illustrating each light emitting unit in a light emitting chip provided by an embodiment of the present application.

The structure and quantity of the epitaxial wafers are not specifically limited here. Exemplarily, FIG. 2 shows an example in which each light emitting unit includes two epitaxial wafers, namely a blue epitaxial wafer 41 and a green epitaxial wafer 42. Exemplarily, each epitaxial wafer may include an electron injection layer, an emission layer, and a hole injection layer stacked in sequence on the substrate; or, each epitaxial wafer may include a hole injection layer, an emission layer and an electron injection layer stacked in sequence on the substrate. FIG. 2 shows an example in which the blue epitaxial wafer 41 includes a first electron injection layer 411, a first emission layer 412, and a first hole injection layer 413 stacked in sequence on the substrate 1.

Here, there is no specific limitation on the distance between adjacent epitaxial wafers in the same light emitting unit. Exemplarily, when the size range of a single epitaxial wafer is less than 50 μm, the distance between adjacent epitaxial wafers includes 5 μm~100 μm, preferably 10 μm~30 μm.

The emission layer is the luminous area of the epitaxial wafer, which can confine the carriers. The material of the emission layer is not specifically limited here. Exemplarily, the material of the emission layer may include multiple quantum wells.

The electron injection layer can be configured to provide electrons, and can be used as the N region of the emission layer. The material of the electron injection layer is not specifically limited here. Exemplarily, the material of the electron injection layer may include any one of gallium nitride (GaN), gallium phosphide (GaP) or zinc oxide (ZnO).

The hole injection layer can be configured to provide holes, and can be used as the P region of the emission layer. The material of the hole injection layer is not specifically limited here. Exemplarily, the material of the hole injection layer may include any one of gallium nitride (GaN), gallium phosphide (GaP) or zinc oxide (ZnO).

The emission layer may further include other film layers. For example, the emission layer includes an electron blocking layer arranged on a side of the emission layer facing away from the electron injection layer, which can be used to prevent electrons from leaking to the P region of the emission layer, and improve the recombination rate of holes and electrons in the luminous recombination region.

Several epitaxial wafers described above share one first electrode. The quantity of epitaxial wafers sharing one first electrode is not specifically limited here, for example, all epitaxial wafers in one light emitting unit share one first electrode; or some epitaxial wafers in one light emitting unit share one first electrode, and the other epitaxial wafers each have a separated first electrode. For example, a light emitting unit includes a blue epitaxial wafer, a green epitaxial wafer and a red epitaxial wafer, where the blue epitaxial wafer and the green epitaxial wafer share one first electrode, and the red epitaxial wafer has a separated first electrode. Alternatively, the epitaxial wafers in one light emitting unit can be divided into several groups, and each group shares one first electrode respectively, which depends on the actual application.

Here, there is no specific limitation on how multiple epitaxial wafers share one first electrode. For example, several epitaxial wafers may be directly electrically connected to one first electrode; or, several epitaxial wafers may be indirectly electrically connected to one first electrode. In the case that several epitaxial wafers are indirectly electrically connected to one first electrode, the several epitaxial wafers may be electrically connected to the first electrode 3 through a conductive layer 5 as shown in FIG. 2 to FIG. 5.

Here, there is no specific limitation on the area of each light emitting unit and the quantity of epitaxial wafers included in each light emitting unit. The quantity of epitaxial wafers is related to the sizes of epitaxial wafers and the distance between the epitaxial wafers. The larger the sizes of epitaxial wafers and the distance between the epitaxial wafers, the smaller the quantity of epitaxial wafers. Exemplarily, when the size range of a single chip is less than 50 μm, the spacing between adjacent light emitting units includes 30 μm~200 μm, preferably 50 μm~100 μm. In this case, chips included in each light emitting unit may be 100×100 to 400×400 chips.

Embodiments of the present application provide a light emitting chip, including: a substrate: a plurality of light emitting units arranged in an array on the substrate; each of the light emitting units includes at least one first electrode and a plurality of epitaxial wafers arranged in an array on the substrate, and at least two of the plurality of epitaxial wafers have different colors, and several epitaxial wafers share one first electrode. On the one hand, at least two epitaxial wafers of different colors are integrally formed on the same substrate, so that the light emitting chips of different colors can be transferred simultaneously to the drive backplane when a mass transfer is performed on all the light emitting chips on the substrate. Therefore, the transfer efficiency of light emitting chips is greatly improved, and the quantity of light emitting chips for mass transfer is effectively reduced, the number of transfers is greatly reduced, and the transfer period is shortened. On the other hand, by sharing one first electrode with several epitaxial wafers, that is, using a common first electrode, the quantity of the first electrodes can be effectively reduced, and the production time, cost and process difficulty can be greatly reduced.

Alternatively, at least two epitaxial wafers of different colors among the epitaxial wafers share one first electrode. Therefore, by sharing one first electrode with at least two epitaxial wafers of different colors, the transfer efficiency of light emitting chips can be further improved while the quantity of the first electrodes can be effectively reduced, the quantity of light emitting chips for mass transfer can be effectively reduced, and the production time and cost can be effectively reduced.

The quantity of epitaxial wafers of different colors is not specifically limited here. For example, the quantity of epitaxial wafers of different colors can be two; or, the quantity of epitaxial wafers of different colors can be three or more.

There is no specific limitation on how the above-mentioned at least two epitaxial wafers of different colors share one first electrode. For example, the at least two epitaxial wafers of different colors can be directly electrically connected to one first electrode; or, the at least two epitaxial wafers of different colors are indirectly electrically connected to one first electrode. In the case that at least two epitaxial wafers of different colors are indirectly electrically connected to one first electrode, at least two epitaxial wafers of different colors can be electrically connected to the first electrode 3 through the conductive layer 5 as shown in FIG. 2 to FIG. 5.

The present application provides a manner in which epitaxial wafers share one first electrode. Optionally, all epitaxial wafers share one first electrode. That is to say, a common first electrode is used, so as to minimize the quantity of the first electrodes and minimize the difficulty of the manufacturing process, the production time and cost while ensuring the normal operation of the light emitting chip.

Here, there is no specific limitation on how all epitaxial wafers share one first electrode. For example, all epitaxial wafers may be directly electrically connected to one first electrode; or, all epitaxial wafers may be indirectly electrically connected to one first electrode. In the case that all epitaxial wafers are indirectly electrically connected to one first electrode, all epitaxial wafers may be electrically connected to the first electrode 3 through the conductive layer 5 as shown in FIG. 2 to FIG. 5.

The present application provides another manner of sharing one first electrode by epitaxial wafers. Optionally, all epitaxial wafers are divided into several groups, each group includes at least two epitaxial wafers of different colors, and each group shares one first electrode. That is, each group shares a common first electrode, so that the quantity of the first electrodes is greatly reduced, and the difficulty of the manufacturing process, the production time and the cost are greatly reduced while ensuring the normal operation of the light emitting chip.

Here, there is no specific limitation on the quantity of epitaxial wafers of different colors included in the groups. For example, the quantity of epitaxial wafers of different colors included in the groups can be two; or, the quantity of epitaxial wafers of different colors included in the groups can be three or more.

Optionally, referring to FIG. 2 to FIG. 5, the epitaxial wafers at least include a blue epitaxial wafer 41 and a green epitaxial wafer 42, and the blue epitaxial wafer 41 and the green epitaxial wafer 42 share one first electrode 3. Therefore, by transferring the blue light emitting chip and the green light emitting chip simultaneously, the transfer efficiency of the light emitting chips can be effectively improved, and the quantity of light emitting chips for mass transfer can be effectively reduced, the number of transfer can be greatly reduced and the transfer period can be shortened.

The difference between the blue epitaxial wafer and the green epitaxial wafer lies in the color of the emission layer, i.e., the blue epitaxial wafer emits blue light, and the green epitaxial wafer emits green light.

Here, there is no specific limitation on the structure and quantity of the blue epitaxial wafers and green epitaxial wafers. Exemplarily, FIG. 2 to FIG. 5 all illustrate an example in which each light emitting unit includes a blue epitaxial wafer 41 and a green epitaxial wafer 42. For example, as shown in FIG. 2, the blue epitaxial wafer 41 includes a first electron injection layer 411, a first emission layer 412, and a first hole injection layer 413 stacked in sequence on the substrate 1; the green epitaxial wafer 42 includes a second electron injection layer 421, a second emission layer 422, and a second hole injection layer 423 stacked in sequence on the substrate 1.

Optionally, as shown in FIG. 2 to FIG. 5, the light emitting unit further includes a conductive layer 5, and the conductive layer 5 is electrically connected to multiple epitaxial wafers and at least one first electrode 3.

Figure 3:
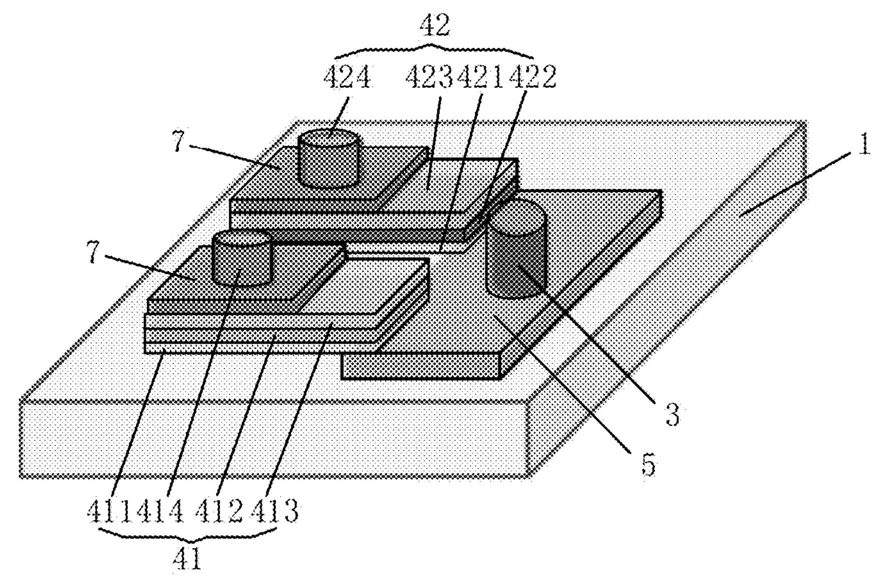
FIG. 3 is a schematic structural diagram illustrating each light emitting unit in another light emitting chip provided by an embodiment of the present application.

The material, shape, location, etc. of the conductive layer are not specifically limited here, as long as the conductive layer can be electrically connected to multiple epitaxial wafers and at least one first electrode. Exemplarily, the material of the conductive layer may include conductive photoresist or conductive fluid. Exemplarily, the conductive layer can be arranged around the first electrode in a grid structure. Of course, the conductive layer can also be arranged as shown in FIG. 3, that is, an orthographic projection of the conductive layer 5 on the substrate 1 partially overlaps with both of orthographic projections of the blue epitaxial wafer 41 and the green epitaxial wafer 42 on the substrate 1. However, attention should be paid to avoid contacting the conductive layer with the emission layer.

The arrangement manner of the conductive layer is not specifically limited here, and needs to be set according to the quantity of shared first electrodes and the like. Exemplarily, in the case that all epitaxial wafers share one first electrode, the conductive layer can be provided as an entire layer, and all epitaxial wafers share one first electrode through the entire layer of the conductive layer. Alternatively, in the case that each group of epitaxial wafers share one first electrode, the conductive layer may include a plurality of discrete conductive sublayers, and each group of epitaxial wafers share one first electrode through one conductive sublayer. FIG. 3 illustrates an example in which the conductive layer 5 is provided as an entire layer.

In the light emitting chip provided in the embodiment of the present application, sharing one first electrode with multiple epitaxial wafers is realized through the conductive layer, that is, a common first electrode is realized through the conductive layer, so that the quantity of the first electrodes can be effectively reduced, and the difficulty of the manufacturing process, the production time and the cost can be greatly reduced.

Optionally, in order to facilitate the fabrication of the conductive layer, as shown in FIG. 3, the conductive layer 5 is provided as an entire layer, and all epitaxial wafers are electrically connected to at least one first electrode 3 through the conductive layer 5.

Figure 4:
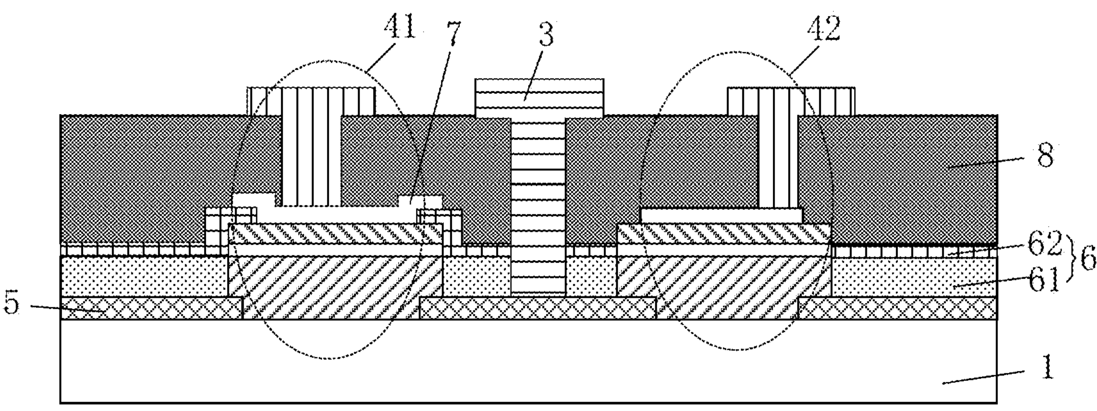
FIG. 4 is a schematic structural diagram illustrating each light emitting unit in another light emitting chip provided by an embodiment of the present application.
Figure 5:
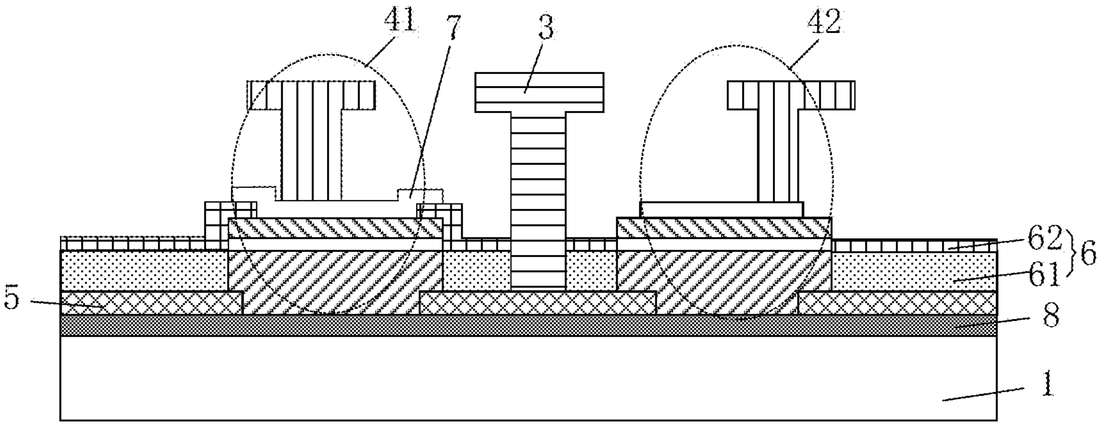
FIG. 5 is a schematic structural diagram illustrating each light emitting unit in yet another light emitting chip provided by an embodiment of the present application.

Optionally, as shown in FIG. 2, FIG. 4 and FIG. 5, the conductive layer 5 includes multiple discrete conductive sublayers 51; all epitaxial wafers are divided into several groups, each group includes at least two epitaxial wafers, and each group of epitaxial wafers are electrically connected to one first electrode 3 via one conductive sublayer 51. Therefore, by sharing the first electrode in each group, the quantity of the first electrodes is effectively reduced, and the difficulty of the manufacturing process, the production time and the cost are greatly reduced.

Here, there is no specific limitation on the quantity and color of the epitaxial wafers included in each of the above groups. For example, the quantity of the epitaxial wafers included in each of the above groups may be two; or, the quantity of the epitaxial wafers included in each of the above groups may be three or more. Exemplarily, the color of the epitaxial wafers included in each of the above groups may be blue, green or the like.

Optionally, as shown in FIG. 2, the orthographic projection E1 of the conductive layer 5 on the substrate 1 (including E11, E12 and E13 in FIG. 2) and the orthographic projection E2 of the epitaxial wafer on the substrate 1 (including E21 and E22 in FIG. 2) partially overlap with each other, and the conductive layer 5 is in direct contact with the epitaxial wafers. Accordingly, sharing the first electrode is realized through the conductive layer.

Optionally, as shown in FIG. 2 and FIG. 3, the conductive layer 5 is disposed on a side of the substrate 1 close to the epitaxial wafer. The epitaxial wafer includes a side surface, a first surface and a second surface opposite to each other. The first surface and the second surface are connected to the side surface respectively, and the second surface of the epitaxial wafer is located on a side of the epitaxial wafer facing away from the substrate 1.

Referring to FIG. 2, the light emitting unit further includes an insulation layer 6 disposed on a side of the conductive layer 5 close to the epitaxial wafer, and the insulation layer 6 covers at least part of the side surface of the epitaxial wafer. On the one hand, the side surface of the epitaxial wafer is protected by the insulation layer, so as to prevent the side surface of the epitaxial wafer from being electrically connected to other structures and affecting the performance of the light emitting chip. On the other hand, by defining a certain area via the insulation layer, the epitaxial wafer is directly fabricated in the area defined by the insulation layer during the manufacturing process, so as to realize the regional growth of the light emitting chip, thereby avoiding the damage on the side wall of the light emitting chip caused by etching and other processes when directly manufacturing the light emitting chip, and ensuring the yield of the product.

The insulation layer covers at least part of the side surface of the epitaxial wafer. There is no specific limitation on how the insulation layer covers the side surface of the epitaxial wafer. For example, the insulation layer may only cover part of the side surface of the epitaxial wafer; or, the insulation layer may cover the entire side surface of the epitaxial wafer; or, the insulation layer may cover the side surface of the epitaxial wafer and part of the second surface of the epitaxial wafer: or, the insulation layer may cover the side surface of the epitaxial wafer and the entire second surface of the epitaxial wafer. FIG. 2 shows an example in which the insulation layer 6 covers the entire side surface and part of the second surface of the blue epitaxial wafer 41, and the insulation layer 6 covers part of the side surface of the green epitaxial wafer 42.

The structure and material of the insulation layer are not specifically limited here. For example, the material of the insulation layer may include any one of silicon oxide, silicon nitride, and a compound of silicon oxide and silicon nitride.

Exemplarily, the insulation layer may include a single-layer structure; or, the insulation layer may include a multi-layer structure. FIG. 2 shows an example in which the insulation layer 6 is a single-layer structure; FIG. 4 and FIG. 5 both show an example in which the insulation layer 6 includes a first insulation sublayer 61 and a second insulation sublayer 62.

Optionally, as shown in FIG. 2 to FIG. 5, the epitaxial wafer includes an electron injection layer and an emission layer stacked in sequence: the conductive layer 5 covers at least part of the side surface of the electron injection layer and is not in contact with the side surface of the emission layer.

In this way, on the one hand, sharing the first electrode is realized through the conductive layer. On the other hand, it can avoid damages on the performance of the light emitting chip due to the contact between the conductive layer and the emission layer. On yet another hand, by defining a certain area via the conductive layer, the epitaxial wafer is directly fabricated in the area defined by the conductive layer during the manufacturing process, so as to realize the regional growth of the light emitting chip, thereby avoiding the damage on the side wall of the light emitting chip caused by etching and other processes when directly manufacturing the light emitting chip, and ensuring the yield of the product.

FIG. 2 to FIG. 5 all show an example in which the blue epitaxial wafer 41 includes a first electron injection layer 411, a first emission layer 412, and a first hole injection layer 413 stacked in sequence on the substrate 1; the green epitaxial wafer 42 includes a second electron injection layer 421, a second emission layer 422, and a second hole injection layer 423 stacked in sequence on the substrate 1. It should be noted that the light emitting unit further includes a first sub-electrode 414 disposed on a side of the first hole injection layer 413 facing away from the substrate 1, and a second sub-electrode 424 disposed on a side of the second electron injection layer 421 facing away from the substrate 1, as shown in FIG. 2 to FIG. 5.

The conductive layer covers at least part of the side surface of the electron injection layer. There is no specific limitation on how the conductive layer covers the side surface of the electron injection layer. For example, the conductive layer only covers a part of the side surface of the electron injection layer; or, the conductive layer covers the entire side surface of the electron injection layer.

The emission layer is the light emitting area of the light emitting chip, which can confine the carriers. The material of the emission layer is not specifically limited here. Exemplarily, the material of the emission layer may include multiple quantum wells.

The emission layer may further include other film layers. For example, the emission layer includes an electron blocking layer arranged on a side of the emission layer facing away from the electron injection layer, which can be used to prevent electrons from leaking to the P region of the emission layer, and improve the recombination rate of holes and electrons in the luminous recombination region.

The electron injection layer can be configured to provide electrons, and can be used as the N region of the emission layer. The material of the electron injection layer is not specifically limited here. Exemplarily, the material of the electron injection layer may include any one of gallium nitride (GaN), gallium phosphide (GaP) or zinc oxide (ZnO).

Optionally, as shown in FIG. 4 and FIG. 5, the insulation layer 6 includes a first insulation sublayer 61 and a second insulation sublayer 62 stacked in sequence: the epitaxial wafer further includes a hole injection layer disposed on a side of the emission layer facing away from the electron injection layer; both the conductive layer 5 and the first insulation sublayer 61 cover part of the side surface of the electron injection layer; the second insulation sublayer 62 covers at least the side surfaces of the emission layer and the hole injection layer.

In this way, on the one hand, a certain area can be defined by the conductive layer and the first insulation sublayer, and the epitaxial wafer is directly fabricated in the area defined by the conductive layer and the first insulation layer during the manufacturing process, thereby realizing the regional growth of the light emitting chip and avoiding damages to the side wall of the light emitting chip caused by etching and other processes when manufacturing the light emitting chip directly. On the other hand, the first insulation sublayer can avoid the contact between the conductive layer and the emission layer, further ensuring the performance of the light emitting chip. On yet another hand, the second insulation layer avoids the epitaxial wafer to be electrically connected to other structures, thereby effectively ensuring the yield rate of the product.

The materials of the first insulation sublayer and the second insulation sublayer are not specifically limited here. For example, the material of the first insulation sublayer may include any one of silicon oxide, silicon nitride, and a compound of silicon oxide and silicon nitride. The second insulation sublayer is similar to the first insulation sublayer, and will not be repeated here.

The second insulation sublayer covers at least the side surfaces of the emission layer and the hole injection layer. Here, there is no specific limitation on how the second insulation sublayer covers the side surfaces of the emission layer and the hole injection layer. For example, the second insulation sublayer can only cover the side surfaces of the emission layer and the hole injection layer; or, the second insulation sublayer can cover the side surfaces of the emission layer and the hole injection layer, and the surfaces of the emission layer and the hole injection layer on a side facing away from the substrate.

The hole injection layer can be configured to provide holes, and can be used as the P region of the emission layer. The material of the hole injection layer is not specifically limited here. Exemplarily, the material of the hole injection layer may include any one of gallium nitride (GaN), gallium phosphide (GaP) or zinc oxide (ZnO).

Optionally, the material of the conductive layer includes any one of metal, conductive photoresist, and conductive fluid.

The material of the conductive photoresist is not specifically limited here. Exemplarily, the material of the conductive photoresist may include a mixture of a positive conductive photoresist and a conductive substance, or a mixture of a negative conductive photoresist and a conductive substance. The conductive substance here may include graphene, silver powder and the like.

Here, the manufacturing process of the conductive photoresist is not specifically limited. Exemplarily, the manufacturing process of the conductive photoresist may include processes such as spin coating, exposure, and development.

The material of the conductive fluid is not specifically limited here. Exemplarily, the material of the conductive fluid may include electrolyte solution (for example sodium chloride solution), silver paste, acid-base solution, conductive ink and the like.

Compared with a situation that the material of the conductive layer is the conductive photoresist, in the case where the material of the conductive layer is the conductive fluid, it has the advantages that the process is simple and easy to operate, and it is very cost-effective. When the material of the conductive layer is the conductive photoresist, it is necessary to use photolithography exposure machine, developing equipment, etc., and when the material of the conductive layer is the conductive fluid, it is only necessary to inject the conductive fluid into a container; meanwhile, the cost of the conductive photoresist is much higher than that of the conductive fluids.

Further, optionally, in order to make a conductive layer with better conductivity and facilitate production, in the case where the material of the conductive layer includes the conductive photoresist, the conductive photoresist includes a negative photoresist and graphene, or a negative photoresist and silver powder.

Embodiments of the present application provide a light emitting chip with a structure. Optionally, as shown in FIG. 5, the light emitting unit further includes a current spreading layer 7 and a reflective layer 8, the current spreading layer 7 being disposed on a side of the hole injection layer facing away from the substrate 1, and the reflective layer 8 being disposed on a side of the electron injection layer close to the substrate 1. The light emitting unit further includes a second electrode disposed on a side of the current spreading layer 7 facing away from the substrate 1. The first electrode 3 is disposed on a side of the conductive layer 5 facing away from the substrate 1 and is electrically connected to the conductive layer 5. Therefore, the arrangement direction of the first electrode and the second electrode is the same as the light emitting direction of the epitaxial wafer.

The first electrode may be electrically connected to the electron injection layer, thereby serving as an n-electrode of the light emitting chip. The second electrode may be electrically connected to the hole injection layer, thereby serving as a p-electrode of the light emitting chip.

The current spreading layer refers to a layer for reducing the contact resistance between the second electrode and the hole injection layer and further spreading the current. The material of the current spreading layer is not specifically limited here, for example, the material of the current spreading layer may include Indium Tin Oxides (ITO).

The reflective layer refers to a layer for reflecting light emitted from the epitaxial wafer. The material and structure of the reflective layer are not specifically limited here. For example, the material of the reflective layer may include a laminated structure of silicon oxide and titanium oxide, for example, a layer of silicon oxide and a layer of titanium oxide.

The material of the second electrode is not specifically limited here, for example, the material of the second electrode may include metal, such as chromium/platinum/gold, titanium/gold. The polarity of the second electrode is not specifically limited here. For example, the second electrode can be an n-type electrode; or, the second electrode can be a p-type electrode, as long as the polarities of the first electrode and the second electrode are opposite, that is, the first electrode is a p-type electrode and the second electrode is an n-type electrode, or the first electrode is an n-type electrode and the second electrode is a p-type electrode. FIG. 2 to FIG. 5 all illustrate an example in which a light emitting chip includes one second electrode and the second electrode is a p-type electrode.

Figure 17:
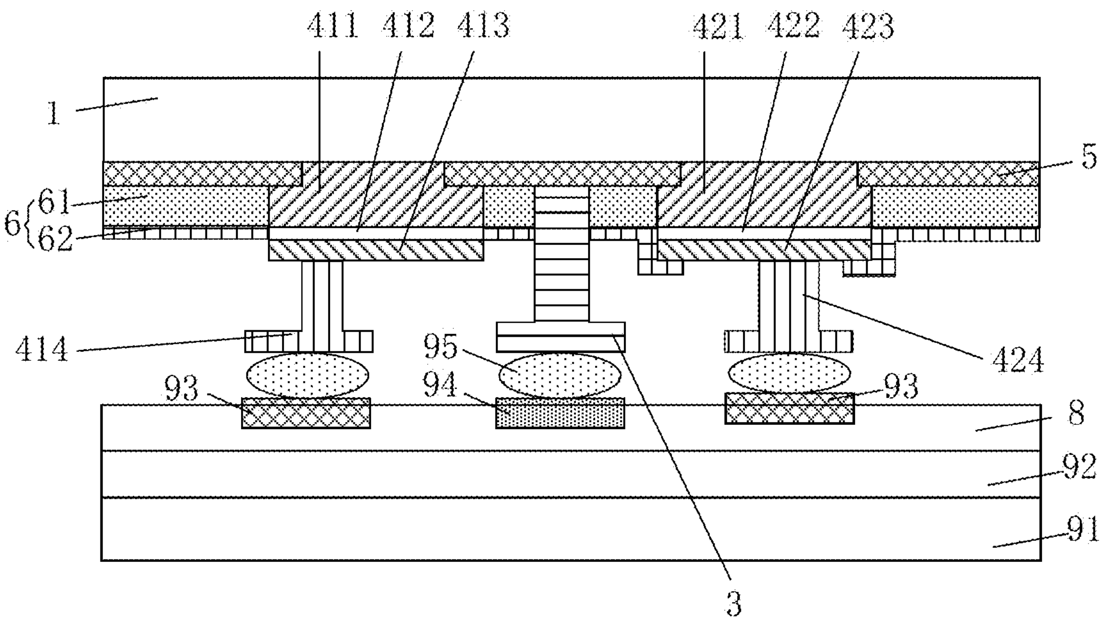
FIG. 17 is a schematic structural diagram illustrating another light emitting chip provided by an embodiment of the present application being transferred to a driving backplane.

It should be noted that the reflective layer in the light emitting chip with the above structure can also be removed, and the light emitting chip with the reflective layer being removed can be transferred to a driving backplane with an emission layer, as shown in FIG. 17, that is, the reflective layer 8 is disposed on a side of the driving backplane 92 close to the light emitting chip. In this way, the arrangement direction of the first electrode and the second electrode may be the same as the light emitting direction of the epitaxial wafer.

Embodiments of the present application provide a light emitting chip with another structure. Optionally, as shown in FIG. 4, the light emitting unit further includes a current spreading layer 7 and a reflective layer 8, the current spreading layer 7 being disposed on a side of the hole injection layer facing away from the substrate 1, and the reflective layer 8 covering the current spreading layer 7. The light emitting unit further includes a second electrode disposed on a side of the reflective layer 8 facing away from the substrate, the second electrode is electrically connected to the current spreading layer 7 through a via hole in the reflective layer 8. The first electrode 3 is arranged on a side of the conductive layer 5 close to the substrate 1, and is electrically connected to the conductive layer 5. Therefore, the arrangement direction of the first electrode and the second electrode is opposite to the light emitting direction of the epitaxial wafer.

Alternatively, embodiments of the present application provide a light emitting chip with yet another structure. Optionally, the light emitting unit further includes a current spreading layer and a reflective layer, the current spreading layer being disposed on a side of the hole injection layer facing away from the substrate, and the reflective layer covering the current spreading layer; the light emitting unit further includes a second electrode arranged on a side of the reflective layer facing away from the substrate, the second electrode is electrically connected to the current spreading layer through a via hole in the reflective layer: the first electrode is arranged on a side of the conductive layer facing away from the substrate, and electrically connected to the conductive layer.

Optionally, the distance between adjacent light emitting units is greater than the distance between adjacent epitaxial wafers. Therefore, it is convenient to manufacture the epitaxial wafers in each light emitting unit, and to facilitate subsequent operations such as detection of the light emitting chips.

Here, there is no specific limitation on the distance between the adjacent light emitting units. Exemplarily, when the size range of a single chip is less than 50 μm, the distance between adjacent light emitting units includes 30 μm~200 μm, particularly 30 μm, 60 μm, 90 μm, 120 μm, 150 μm or 200 μm and so on.

Further, optionally, the distance between adjacent light emitting units includes 50 μm~100 μm, particularly 50 μm, 70 μm, 90 μm or 100 μm and so on.

Here, there is no specific limitation on the distance between the adjacent epitaxial wafers. Exemplarily, when the size range of a single epitaxial wafer is less than 50 μm, the distance between adjacent epitaxial wafers includes 5 μm~100 μm, particularly 5 μm, 10 μm, 30 μm, 50 μm, 80 μm or 100 μm and so on.

Further, optionally, the distance between adjacent epitaxial wafers includes 10 μm~30 μm, particularly 10 μm, 20 μm or 30 μm and so on.

Embodiments of the present application further provide a method for manufacturing the above-mentioned light emitting chip including a substrate and a plurality of light emitting units arranged in an array arranged on the substrate, where each of the light emitting unit includes a conductive layer and an epitaxial wafer, the conductive layer being arranged on a side of the epitaxial wafer close to the substrate and being electrically connected with the epitaxial wafer.

The method includes steps described below.

At S1, a substrate is provided.

The material of the substrate is not specifically limited here. Exemplarily, the material of the substrate may include any one of sapphire, silicon or silicon carbide.

Figure 6:
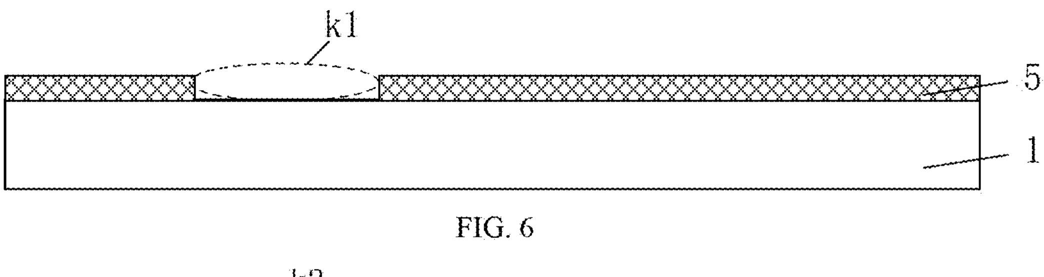
FIG. 6-FIG. 14 are diagrams illustrating a manufacturing process for forming a light emitting unit with the structure shown in FIG. 4, provided by an embodiment of the present application.

At S2, referring to FIG. 6, a conductive layer 5 is formed on the substrate 1.

Here, there is no specific limitation on the process of forming the conductive layer. Exemplarily, the process of forming the conductive layer may include coating, sputtering and the like.

The material of the conductive layer is not specifically limited here. Exemplarily, the material of the conductive layer may include conductive photoresist or conductive fluid.

At S3, referring to FIG. 6, the conductive layer 5 is processed to form at least one first recess k1 penetrating through the conductive layer 5.

Here, there is no specific limitation on the process for forming the first recess. Exemplarily, the process for forming the first recess may include etching and the like.

Here, there is no specific limitation on the size of the first recess, as long as the first recess can accommodate the epitaxial wafer.

Figure 8:
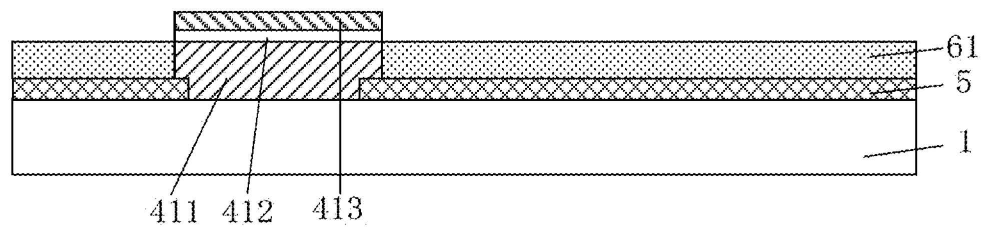

At S4, referring to FIG. 8, an epitaxial wafer is formed in the first recess.

The structure, color and the like of the epitaxial wafer are not specifically limited here. Exemplarily, the epitaxial wafer may include an electron injection layer, an emission layer and a bole injection layer stacked in sequence on the substrate. Exemplarily, the color of the epitaxial wafer may be blue, green and so on.

According to the manufacturing method provided in the embodiment of the present application, a certain area can be defined through the conductive layer, the epitaxial wafer is directly fabricated in the area defined by the conductive layer during the manufacturing process, so as to realize the regional growth of the light emitting chip, thereby avoiding the damage on the side wall of the light emitting chip caused by etching and other processes when directly manufacturing the light emitting chip, and ensuring the yield of the product.

Optionally, the light emitting unit further includes a first insulation layer disposed on a side of the conductive layer facing away from the substrate.

After at least one first recess penetrating through the conductive layer is formed by treating the conductive layer at S3, the method further includes steps described below.

Figure 7:
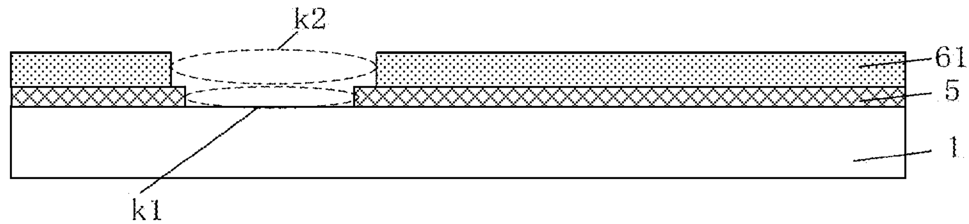

At S5, referring to FIG. 7, a first insulation sublayer 61 is formed on the conductive layer 5 having at least one first recess k1.

Here, the material of the first insulation sublayer is not specifically limited. Exemplarily, the material of the first insulation sublayer may include any one of silicon oxide, silicon nitride, and a compound of silicon oxide and silicon nitride.

At S6, referring to FIG. 7, the first insulation sublayer 61 is processed to form at least one second recess k2 penetrating through the first insulation sublayer 61.

The first recesses are arranged in correspondence with the second recesses.

Here, there is no specific limitation on the process for forming the second recess. Exemplarily, the process for forming the second recess may include etching and the like.

Here, there is no specific limitation on the size of the second recess, as long as the second recess can accommodate the epitaxial wafer.

At S7, referring to FIG. 8, an epitaxial wafer is formed in the first recess and the second recess.

According to the manufacturing method provided in the embodiment of the present application, a certain area can be defined through the conductive layer and the first insulation layer, the epitaxial wafer is directly fabricated in the area defined by the conductive layer and the first insulation layer during the manufacturing process, so as to realize the regional growth of the light emitting chip, thereby avoiding the damage on the side wall of the light emitting chip caused by etching and other processes when directly manufacturing the light emitting chip, and ensuring the yield of the product. Meanwhile, the first insulation layer can also avoid the electrical connection between the conductive layer and the emission layer in the epitaxial wafer as far as possible, further ensuring good performance of the epitaxial wafer.

Optionally, the light emitting unit further includes a second insulation sublayer disposed on a side of the first insulation sublayer facing away from the substrate.

Forming the epitaxial wafer in the first recess and the second recess at S7 includes:

at S71, forming a blue epitaxial wafer in the first recess and the second recess.

The blue epitaxial wafer refers to an epitaxial wafer emitting blue light.

After forming the epitaxial wafer in the first recess and the second recess at S7, the method further includes steps described below.

Figure 9:
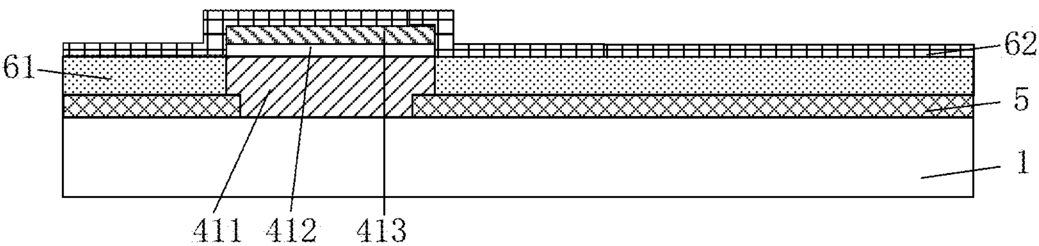

At S8, referring to FIG. 9, a second insulation sublayer 62 is formed on the first insulation sublayer 61 and the blue epitaxial wafer.

Here, the material of the second insulation sublayer is not specifically limited. Exemplarily, the material of the second insulation sublayer may include any one of silicon oxide, silicon nitride, and a compound of silicon oxide and silicon nitride.

Figure 10:
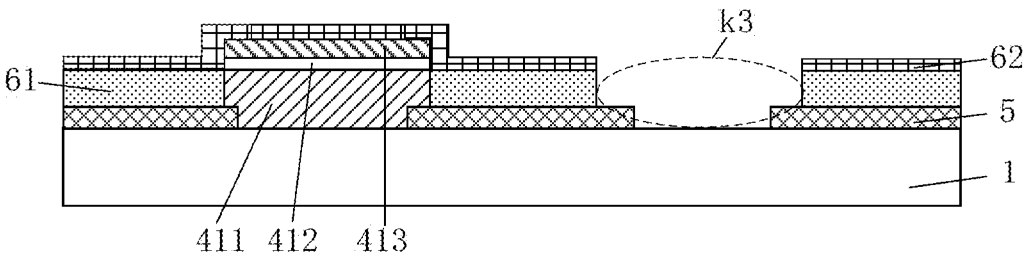

At S9, referring to FIG. 10, the second insulation sublayer 62, the first insulation sublayer 61 and the conductive layer 5 are processed to form at least one third recess k3 penetrating through the second insulation sublayer 62, the first insulation sublayer 61 and the conductive layer 5.

There is spacing between the first recess (or the second recess) and the third recess.

Here, there is no specific limitation on the process for forming the third recess. Exemplarily, the process for forming the third recess may include etching and the like.

Here, there is no specific limitation on the size of the third recess, as long as the third recess can accommodate the epitaxial wafer.

Figure 11:
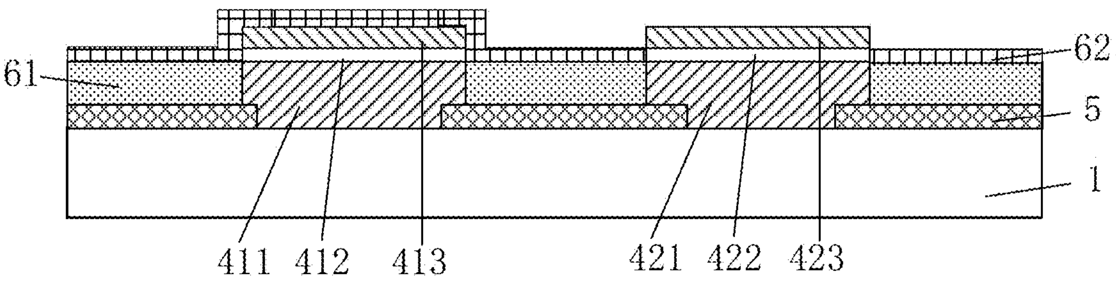

At S10, referring to FIG. 11, a green epitaxial wafer is formed in the third recess.

The green epitaxial wafer refers to an epitaxial wafer emitting green light.

According to the manufacturing method provided by the embodiment of the present application, a certain area can be defined by the conductive layer, the first insulation layer and the second insulation layer, the epitaxial wafer is directly fabricated in the area defined by the conductive layer, the first insulation layer and the second insulation layer during the manufacturing process, so as to realize the regional growth of the light emitting chip, thereby avoiding the damage on the side wall of the light emitting chip caused by etching and other processes when directly manufacturing the light emitting chip, and ensuring the yield of the product.

Meanwhile, the first insulation layer can also avoid the electrical connection between the conductive layer and the emission layer in the epitaxial wafer as far as possible, further ensuring good performance of the epitaxial wafer. Moreover, the second insulation layer can also avoid the epitaxial wafer from being electrically connected with other structures as much as possible, further ensuring good performance of the epitaxial wafer.

A method for manufacturing the light emitting chip will be described in detail below by taking the light emitting chip shown in FIG. 4 as an example.

The method includes steps described below.

At S01, referring to FIG. 6, a conductive layer 5 with a first opening is formed on the substrate 1.

At S02, referring to FIG. 7, a first insulation sublayer 61 is formed on the conductive layer 5.

At S03, referring to FIG. 8, a first electron injection layer 411, a first emission layer 412 and a first hole injection layer 413 are sequentially formed in the first opening of the conductive layer 5 and the first insulation sublayer 61.

At S04, referring to FIG. 9, a second insulation sublayer 62 is formed on the first hole injection layer 413 and the first insulation sublayer 61.

At S05, referring to FIG. 10, the second insulation sublayer 62, the first insulation sublayer 61 and the conductive layer 5 are etched to form a second opening.

At S06, referring to FIG. 11, a second electron injection layer 421, a second emission layer 422 and a second hole injection layer 423 are sequentially formed in the second opening.

Figure 12:
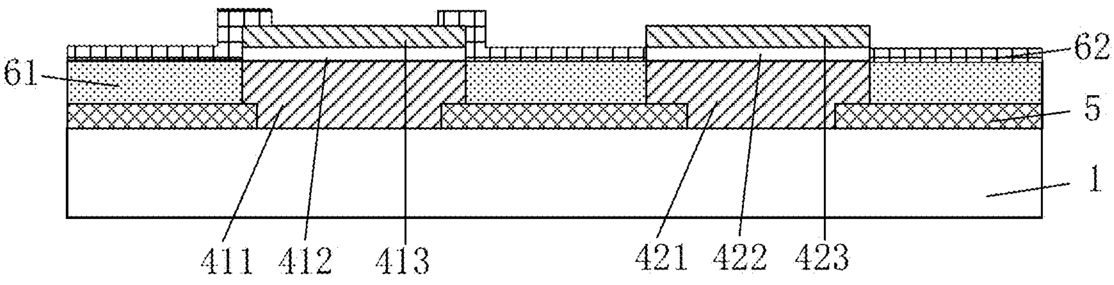

At S07, referring to FIG. 12, the second insulation sublayer 62 on the first hole injection layer 413 is etched to form a third opening.

Figure 13:
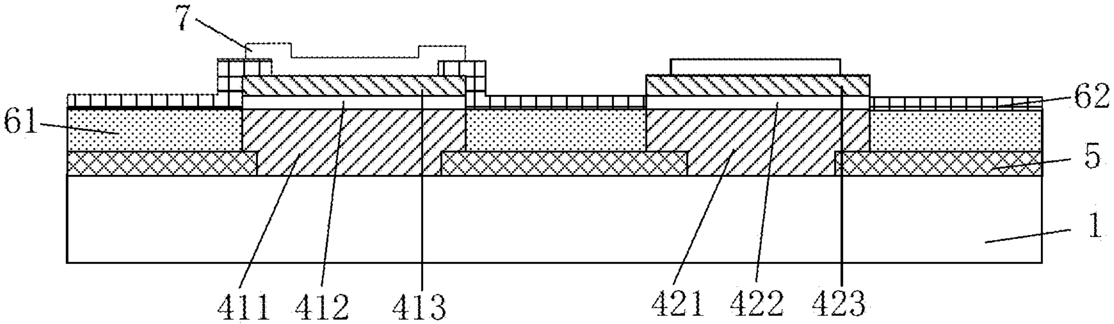

At S08, referring to FIG. 13, a current spreading layer 7 is formed in the third opening and on the second hole injection layer 423.

Figure 14:
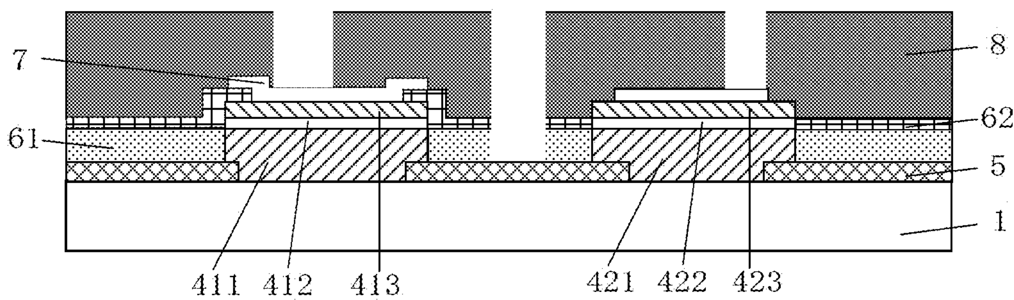

At S09, referring to FIG. 14, a reflective layer with a fourth opening is formed on the current spreading layer 7.

At S010, referring to FIG. 4, a first electrode 3, a first sub-electrode 414 and a second sub-electrode 424 are formed in the fourth opening.

Embodiments of the present application further provide a light emitting device including the above light emitting chip.

In the light emitting device provided by the embodiments of the present application, by sharing one first electrode with multiple epitaxial wafers in the light emitting chip, that is, using a common first electrode, the quantity of the first electrodes can be effectively reduced, and the production time, cost and process difficulty can be greatly reduced.

Figures 15, 16:
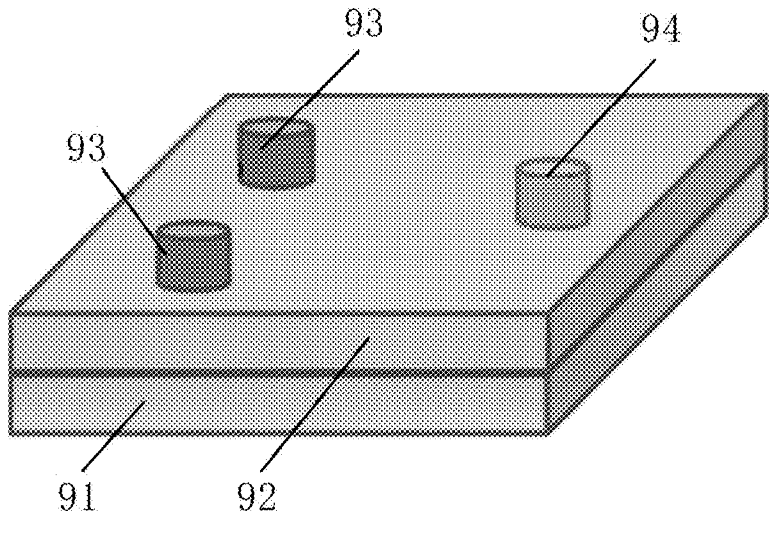
FIG. 15 is a schematic structural diagram illustrating a base plate and a driving backplane provided by an embodiment of the present application.
FIG. 16 is a schematic structural diagram illustrating a light emitting chip provided by an embodiment of the present application being transferred to a driving backplane.

Optionally, as shown in FIG. 15 and FIG. 16, the light emitting device further includes a base plate 91 and a driving backplane 92 disposed on the base plate 91. A side of the driving backplane 92 facing away from the base plate 91 is provided with a plurality of anodes 93 and a plurality of cathodes 94. The light emitting chip is arranged opposite to the driving backplane. Each of the cathodes 94 is electrically connected to one first electrode 3 of the light emitting chip, and each of the anodes 93 is electrically connected to one second electrode of the light emitting chip.

Here, there is no specific limitation on the manner in which each cathode is electrically connected to one first electrode of the light emitting chip. For example, each of the cathodes may be directly electrically connected to one first electrode of the light emitting chip; or, each of the cathodes may be indirectly electrically connected to one first electrode of the light emitting chip. In the case that each cathode can be electrically connected indirectly to one first electrode of the light emitting chip, as shown in FIG. 16, each cathode 94 is electrically connected to one first electrode 3 of the light emitting chip through a pad 95.

Here, there is no specific limitation on the manner in which each anode is electrically connected to one second electrode of the light emitting chip. For example, each of the anodes may be directly electrically connected to one second electrode of the light emitting chip; or, each of the anodes may be indirectly electrically connected to one second electrode of the light emitting chip. In the case that each anode can be electrically connected indirectly to one second electrode of the light emitting chip, as shown in FIG. 16, each anode 93 is electrically connected to one second electrode of the light emitting chip through a pad 95.

Figure 18:
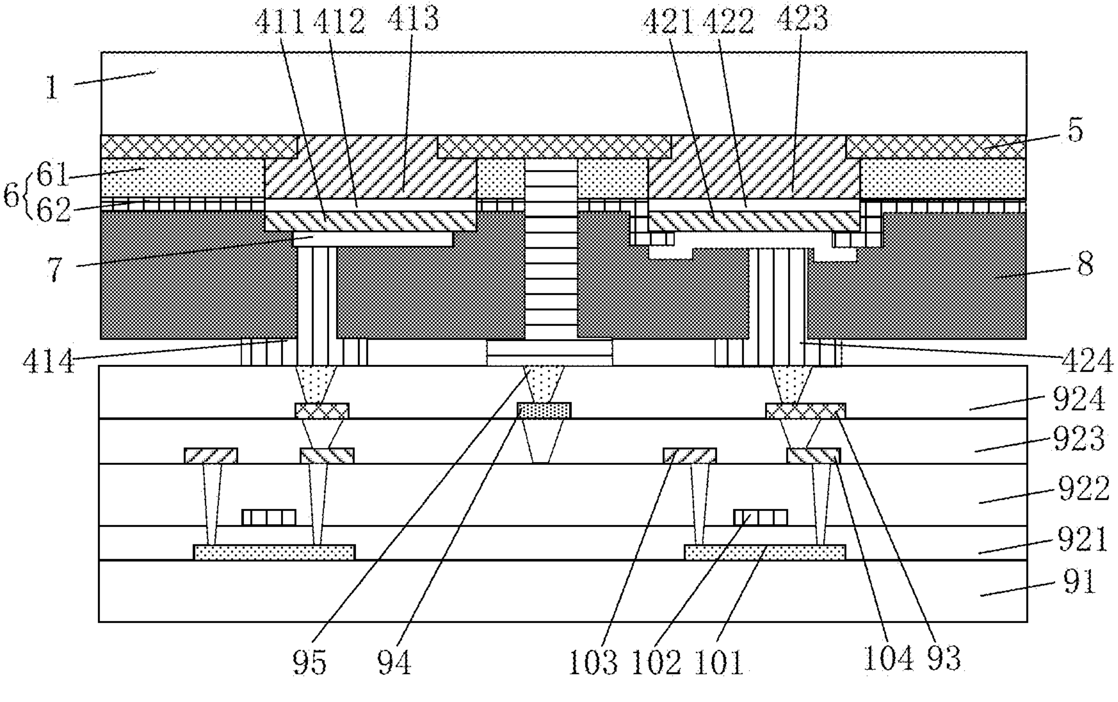
FIG. 18 is a schematic structural diagram illustrating yet another light emitting chip provided by an embodiment of the present application being transferred to a driving backplane.

The structure of the driving backplane is not specifically limited here. For example, referring to FIG. 18, the driving backplane 92 includes a base plate 91, and an active layer 101, a gate insulation layer 921, a gate 102, an interlayer dielectric layer 922, a source electrode 103 and a drain electrode 104, a protective layer 923, the anode 93 and the cathode 94, a planar layer 924 sequentially stacked on the base plate 91. The source electrode 103 and the drain electrode 104 are in contact with the active layer 101 through via holes respectively. The anode 93 is in contact with the drain electrode 104 through a via hole, and the cathode 94 is in contact with the interlayer dielectric layer 922 through a via hole. Further, a pad 95 is also provided inside the via hole in the planar layer 924.

In the description provided herein, numerous specific details are set forth. However, it is understood that embodiments of the present disclosure may be practiced without these specific details. In some instances, well-known methods, structures and techniques have not been shown in detail so as to not obscure the understanding of this description.

Finally, it should be noted that the above embodiments are only used to illustrate the technical solutions of the present disclosure, but not to limit them; although the present disclosure has been described in detail with reference to the above embodiments, those skilled in the art should understand that, the technical solutions described in the above embodiments can still be modified, or some or all of the technical features thereof can be equivalently replaced; and these modifications or replacements do not make the essence of the corresponding technical solutions deviate from the sprits and scope of the technical solutions of the embodiments of the present disclosure.

The invention claimed is:

1. A light emitting chip, comprising:

a substrate;

a plurality of light emitting units arranged in an array on the substrate, wherein each of the light emitting units comprises at least one first electrode arranged on the substrate and a plurality of epitaxial wafers arranged in an array, and at least two of the epitaxial wafers have different colors;

wherein several epitaxial wafers in the epitaxial wafers share one of the at least first electrode;

wherein each of the light emitting units further comprises a conductive layer, and the conductive layer is electrically connected to the plurality of epitaxial wafers and the at least one first electrode;

wherein an orthographic projection of the conductive layer on the substrate partially overlaps with an orthographic projection of the epitaxial wafers on the substrate, and the conductive layer is in direct contact with the epitaxial wafers.

2. The light emitting chip according to claim 1, wherein at least two epitaxial wafers of different colors in the plurality of epitaxial wafers share one of the at least one first electrode.

3. The light emitting chip according to claim 2, wherein all of the epitaxial wafers share one of the at least one first electrode.

4. The light emitting chip according to claim 2, wherein all the epitaxial wafers are divided into several groups, each of the groups comprises at least two epitaxial wafers of different colors, and each of the groups shares one of the at least one first electrode.

5. The light emitting chip according to claim 2, wherein the epitaxial wafers comprise at least a blue epitaxial wafer and a green epitaxial wafer, and the blue epitaxial wafer and the green epitaxial wafer share one of the at least one first electrode.

6. The light emitting chip according to claim 1, wherein the conductive layer is arranged as an entire layer, and all the epitaxial wafers are electrically connected to the at least one first electrode through the conductive layer.

7. The light emitting chip according to claim 1, wherein the conductive layer comprises a plurality of discrete conductive sublayers; all the epitaxial wafers are divided into several groups, each of the groups comprises at least two epitaxial wafers, and each group of the epitaxial wafers are electrically connected to one of the at least one first electrode through one of the conductive sublayers respectively.

8. The light emitting chip according to claim 1, wherein the conductive layer is disposed on a side of the substrate close to the epitaxial wafers; each of the epitaxial wafers comprises a side surface, a first surface and a second surface opposite to each other, wherein the first surface and the second surface are both connected to the side surface, and the second surface of the epitaxial wafer is located on a side of the epitaxial wafer facing away from the substrate;

wherein the light emitting unit further comprises an insulation layer disposed on a side of the conductive layer close to the epitaxial wafer, and the insulation layer covers at least part of the side surface of the epitaxial wafer.

9. The light emitting chip according to claim 8, wherein each of the epitaxial wafers comprises an electron injection layer and an emission layer stacked in sequence;

wherein the conductive layer covers at least part of the side surface of the electron injection layer, and is not in contact with the side surface of the emission layer.

10. The light emitting chip according to claim 9, wherein the insulation layer comprises a first insulation sublayer and a second insulation sublayer stacked in sequence; each of the epitaxial wafers further comprises a hole injection layer arranged on a side of the emission layer facing away from the electron injection layer;

wherein the conductive layer and the first insulation sublayer both cover part of the side surface of the electron injection layer; the second insulation sublayer covers at least the side surface of the emission layer and the side surface of the hole injection layer.

11. The light emitting chip according to claim 10, wherein each of the light emitting units further comprises: a current spreading layer disposed on a side of the hole injection layer facing away from the substrate; and a reflective layer disposed on a side of the electron injection layer close to the substrate;

wherein each of the light emitting units further comprises a second electrode disposed on a side of the current spreading layer facing away from the substrate; the first electrode is disposed on a side of the conductive layer facing away from the substrate, and is electrically connected to the conductive layer.

12. The light emitting chip according to claim 10, wherein each of the light emitting units further comprises: a current spreading layer disposed on a side of the hole injection layer facing away from the substrate; and a reflective layer covering the current spreading layer;

wherein each of the light emitting units further comprises a second electrode disposed on a side of the reflective layer facing away from the substrate, the second electrode is electrically connected to the current spreading layer through a via hole in the reflective layer;

wherein the first electrode is disposed on a side of the conductive layer close to the substrate, and is electrically connected to the conductive layer; or the first electrode is disposed on a side of the conductive layer facing away from the substrate, and is electrically connected to the conductive layer.

13. The light emitting chip according to claim 1, wherein material of the conductive layer comprises any one of metal, conductive photoresist, and conductive fluid.

14. The light emitting chip according to claim 1, wherein a distance between adjacent light emitting units is greater than a distance between adjacent epitaxial wafers.

15. A light emitting device, comprising a light emitting chip, wherein the light emitting chip comprises:

a substrate;

a plurality of light emitting units arranged in an array on the substrate, wherein each of the light emitting units comprises at least one first electrode arranged on the substrate and a plurality of epitaxial wafers arranged in an array, and at least two of the epitaxial wafers have different colors;

wherein several epitaxial wafers in the epitaxial wafers share one of the at least first electrode;

wherein each of the light emitting units further comprises a conductive layer, and the conductive layer is electrically connected to the plurality of epitaxial wafers and the at least one first electrode;

wherein an orthographic projection of the conductive layer on the substrate partially overlaps with an orthographic projection of the epitaxial wafers on the substrate, and the conductive layer is in direct contact with the epitaxial wafers.

16. A method for manufacturing a light emitting chip, wherein the light emitting chip comprises a substrate and a plurality of light emitting units arranged in an array on the substrate, wherein each of the light emitting units comprises at least one first electrode arranged on the substrate and a plurality of epitaxial wafers arranged in an array, and at least two of the epitaxial wafers have different colors; several epitaxial wafers in the epitaxial wafers share one of the at least first electrode; wherein each of the light emitting units comprises a conductive layer, and the conductive layer is arranged on a side of the epitaxial wafers close to the substrate, and is electrically connected to the epitaxial wafers;

wherein the method comprises:

providing the substrate;

forming the conductive layer on the substrate;

processing the conductive layer to form at least one first recess penetrating through the conductive layer; and forming the epitaxial wafer in the first recess.

17. The method according to claim 16, wherein each of the light emitting units further comprises a first insulation sublayer disposed on a side of the conductive layer facing away from the substrate;

wherein, after processing the conductive layer to form at least one first recess penetrating through the conductive layer, the method further comprises:

forming the first insulation sublayer on the conductive layer with the at least one first recess;

processing the first insulation sublayer to form at least one second recess penetrating through the first insulation sublayer, wherein each of the first recesses is arranged in correspondence to each of the second recesses; and forming the epitaxial wafer in the first recess and the second recess.

18. The method according to claim 17, wherein each of the light emitting unit further comprises a second insulation sublayer disposed on a side of the first insulation sublayer facing away from the substrate;

wherein the forming the epitaxial wafer in the first recess and the second recess comprises forming a blue epitaxial wafer in the first recess and the second recess;

wherein after the forming the epitaxial wafer in the first recess and the second recess, the method further comprises:

forming the second insulation sublayer on the first insulation sublayer and the blue epitaxial wafer;

processing the second insulation sublayer, the first insulation sublayer and the conductive layer to form at least one third recess penetrating through the second insulation sublayer, the first insulation sublayer and the conductive layer, wherein a spacing exists between the first recess and the third recess as well as between the second recess and the third recess; and forming a green epitaxial wafer in the third recess.

* * * * *